United States Patent [19]

Geissler et al.

[11] Patent Number: 4,705,740
[45] Date of Patent: Nov. 10, 1987

[54] RADIATION-POLYMERIZABLE MIXTURE, COPOLYMER CONTAINED THEREIN, AND A PROCESS FOR THE PREPARATION OF THE COPOLYMER

[75] Inventors: Ulrich Geissler, Hochheim/Main; Klaus Albrecht, Mainz, both of Fed. Rep. of Germany

[73] Assignee: Hoechst Aktiengesellschaft, Fed. Rep. of Germany

[21] Appl. No.: 753,945

[22] Filed: Jul. 11, 1985

[30] Foreign Application Priority Data

Jul. 26, 1984 [DE] Fed. Rep. of Germany ....... 3427519

[51] Int. Cl.$^4$ .......................... G03C 1/68; C08F 20/06
[52] U.S. Cl. ..................................... 430/288; 430/910; 430/281; 525/242; 522/121; 522/95; 526/317
[58] Field of Search ....................... 430/910, 281, 288; 522/121, 95; 526/317

[56] References Cited

U.S. PATENT DOCUMENTS

| | | | |
|---|---|---|---|
| 3,554,913 | 1/1971 | Gisser et al. | 252/56 |
| 3,833,384 | 9/1974 | Noonan et al. | 430/910 X |
| 4,296,196 | 10/1981 | Faust | 430/284 |
| 4,361,640 | 11/1982 | Pine | 430/910 X |
| 4,427,760 | 1/1984 | Nagazawa et al. | 430/910 X |

FOREIGN PATENT DOCUMENTS 2509473 9/1976 Fed. Rep. of Germany .
2059982 3/1981 United Kingdom .

OTHER PUBLICATIONS

Robert W. Lenz, "Polymerization Mechanism and Processes", in *Kirk–Othmer Encyclopedia of Chemical Technology*, second edition, vol. 16, John Wiley and Sons, Inc., 1968, pp. 238–242.
European Search Report.
Polymer Handbook–J. Brandrup & E. H. Immergut, pp. 144–149.

*Primary Examiner*—John E. Keith
*Assistant Examiner*—Cynthia Hamilton
*Attorney, Agent, or Firm*—Schwartz, Jeffery, Schwaab, Mack, Blumenthal & Evans

[57] ABSTRACT

A layer comprised of a radiation-polymerizable mixture containing (a) a first compound capable of undergoing free radical polymerization, the first compound containing at least two terminal ethylenically unsaturated groups and having a boiling point above 100° C. under atmospheric pressure, (b) a second compound capable of initiating the polymerization of the first compound when exposed to actinic radiation, and (c) a water-insoluble copolymer which is soluble in aqueous alkaline solutions and which comprises (c1) an $\alpha\beta$-unsaturated aliphatic carboxylic acid and (c2) an alkyl methacrylate having at least 4 carbon atoms in the alkyl group, wherein the copolymer has a mean molecular weight in the range from about 50,000 to 200,000 possesses high flexiblity and resilience in both unexposed and exposed states. The mixture is particularly suitable for use as dry resist material for the tenting technique in printed circuit board production.

17 Claims, No Drawings

RADIATION-POLYMERIZABLE MIXTURE, COPOLYMER CONTAINED THEREIN, AND A PROCESS FOR THE PREPARATION OF THE COPOLYMER

BACKGROUND OF THE INVENTION

The invention relates to a mixture which contains (a) a compound which can undergo free radical polymerization, contains at least two terminal ethylenically unsaturated groups and has a boiling point of above 100° C. under atmospheric pressure, (b) a compound capable of initiating the polymerization of compound (a) under the action of actinic radiation, and (c) a water-insoluble copolymer which is soluble in aqueous alkaline solutions.

Polymerizable mixtures of the stated type are known, and are used, inter alia, for the preparation of photopolymerizable printing plates and photoresist materials. A preferred field of use for such mixtures is in the preparation of dry photoresist materials.

German Offenlegungsschrift No. 2,064,080 describes mixtures of this type that contain, as binders, copolymers of methacrylic acid and alkyl methacrylates having at least 4 carbon atoms in the alkyl group, preferably terpolymers of methacrylic acid, methyl or ethyl methacrylate and an alkyl methacrylate having 4 to 15 carbon atoms in the alkyl group. These mixtures form flexible layers which adhere well but which, when they are relatively thick, e.g., greater than 20 μm, tend to exhibit cold flow and, on prolonged storage in the form of coated, rolled-up dry resist films, extrude at the edges of the roll and stick.

German Offenlegungsschrift No. 2,363,806 describes similar mixtures which contain terpolymers of methacrylic acid, an alkyl methacrylate having at least 4 carbon atoms in the alkyl group and a further monomer whose associated homopolymer has a glass transition temperature of at least 80° C. Particular examples of such monomers are styrene, substituted styrenes and acrylonitrile. These mixtures have a considerably reduced cold flow but are completely unsuitable, or can be used only to a limited extent, for certain applications, such as the covering of holes in base materials (the so-called "tenting" technique). The tenting technique is used with increasing frequency for the production of printed circuit boards. When processed by the copper clad technique, the drilled and brushed boards are chemically metallized in the holes and then reinforced over the entire surface, to the required thickness of the final layer, in an electrolytic copper-plating bath. The board is thereafter laminated with a photoresist and then exposed to actinic radiation. During this procedure, the resist layer is cured in the areas of the wiring paths and solder pads. The holes are covered on both sides by cured resist areas, which remain during development of the layer. The bared areas of the copper layer are etched away.

The tenting technique is also important for the covering of so-called holding or position holes. These are holes of up to 6 mm or more in diameter which are provided in the boards to permit handling during various treatment steps. In accordance with the semiadditive method for the production of printed circuit boards, metal is deposited electrolytically in those areas not covered by the resist template. During this procedure, the position holes must also be covered, since otherwise they would be narrowed by metal deposition and would thereby be rendered useless for further processing. The resist template is then removed, and the conductive copper underneath is etched away with an etching agent, the copper present in the holding holes and position holes also being removed.

The photoresist thus has to meet strict requirements in the tenting technique. In the exposed state, it must be flexible and resistant to etching and plating baths, and must be self-supporting in covering holes of 6 mm and more.

German Auslegeschrift No. 2,517,656 describes other mixtures, similar to those described above, that contain, as a binder, a combination of two acidic polymers. Under certain conditions, one of these polymers is soluble in dilute aqueous sodium hydroxide solution and the other is insoluble. The methacrylic acid copolymers described therein are insoluble in the aqueous sodium hydroxide solution.

SUMMARY OF THE INVENTION

It is an object of the present invention to provide a radiation-polymerizable mixture suitable for the preparation of dry photoresist materials which are developed readily and completely with aqueous alkaline solutions.

It is another object of the present invention to provide a copolymer usable in producing radiation-sensitive layers displaying high flexibility, little cold flow and sufficient self-support strength and adherence-to-substrate, when laminated to drilled, copper-plated boards of insulating material, as to be suitable for covering drilled holes of more than 1 mm in diameter.

It is also an object of the present invention to provide a process for producing the above-mentioned copolymer.

In accomplishing the foregoing objects, there has been provided, in accordance with one aspect of the present invention, a radiation-polymerizable mixture comprising (a) a first compound capable of undergoing free radical polymerization, the first compound containing at least two terminal ethylenically unsaturated groups and having a boiling point above 100° C. under atmospheric pressure, (b) a second compound capable of initiating the polymerization of the first compound when exposed to actinic radiation, and (c) a water-insoluble copolymer which is soluble in aqueous alkaline solutions and which comprises (c1) an α,β-unsaturated aliphatic carboxylic acid and (c2) an alkyl methacrylate having at least 4 carbon atoms in the alkyl group, wherein the copolymer has a mean molecular weight in the range from about 50,000 to 200,000. In one preferred embodiment of the present invention the aforesaid radiation-polymerizable mixture further comprises a monomeric ethylenically unsaturated compound (c3) which is copolymerizable with the acid (c1) and the methacrylate (c2), a homopolymer of the compound (c3) having a glass transition temperature of at least 80° C.

In accordance with another aspect of the present invention, there has been provided a copolymer which comprises (i) an α,β-unsaturated aliphatic carboxylic acid and (ii) an alkyl methacrylate which comprises an alkyl group containing at least 4 carbon atoms, the copolymer having a mean molecular weight in the range from about 50,000 to 200,000.

There has also been provided a process for producing a copolymer, comprising the step of polymerizing a monomeric mixture comprised of an α,β-unsaturated aliphatic carboxylic acid and an alkyl methacrylate which comprises an alkyl group containing at least 4 carbon atoms, the polymerizing being effected by mass polymerization in the presence of a free radical polymerization initiator, to produce a copolymer comprised of at least the unsaturated carboxylic acid and the alkyl methacrylate. In one preferred embodiment the aforesaid mixture further comprises at least one monomeric ethylenically unsaturated compound which is copolymerizable with the unsaturated carboxylic acid and the alkyl methacrylate, a homopolymer of the compound having a glass transition temperature of at least 80° C.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

In the radiation-polymerizable mixture of the present invention, the water-insoluble copolymer has a mean molecular weight in the range from about 50,000 to 200,000.

Particularly preferred are copolymers of an $\alpha,\beta$-unsaturated aliphatic carboxylic acid, an alkyl methacrylate having at least 4 carbon atoms in the alkyl group and, if appropriate, at least one monomeric ethylenically unsaturated compound which is copolymerizable with the unsaturated carboxylic acid and the alkyl methacrylate and whose associated homopolymer has a glass transition temperature of at least 80° C.

Layers which have good flexibility and toughness, and which can also be developed adequately in aqueous alkaline solutions, are obtained in accordance with the present invention using mixtures in which the copolymer has a molecular weight of 65,000 to 150,000.

A copolymer used in the present invention preferably contains, as the unsaturated aliphatic carboxylic acid denoted "c1" above, acrylic acid, methacrylic acid, crotonic acid, sorbic acid, maleic acid or itaconic acid, or half esters of the aforesaid dicarboxylic acids. Methacrylic acid has proven very particularly advantageous.

The alkyl methacrylate (component c2) preferably has 4 to 20, in particular 6 to 12, carbon atoms in the alkyl group. Its associated homopolymer should preferably have a glass transition temperature of not more than 20° C.

Copolymers that contain only components c1 and c2 are suitable as binders when the unsaturated carboxylic acid c1 forms a homopolymer having a Tg value of above 80° C., preferably of at least 100° C. The glass transition temperature of these copolymers increases with the acid content, even without the addition of a c3 component. Copolymers having a higher glass transition temperature make it possible in turn to increase the monomer content in the layer without cold flow resulting. As a rule, these copolymers containing only the two components are preferred for many applications because they can be prepared in a simple manner and their composition can be more easily reproduced than in the case of copolymers of three or more components.

In many cases where it is desirable to vary the glass transition temperature of the copolymer independently of its acid number, or where other properties are to be influenced in a selective manner, it is advantageous, however, to employ a further monomer c3 which forms homopolymers having Tg values of at least 80° C., preferably at least 100° C. Examples of suitable monomers of this type include styrene and substituted styrenes, such as vinyltoluene, 4-chlorostyrene, propen-2-ylbenzene, 1-chlorobenzene, vinyl ethyl benzene and 2-methoxystyrene; vinylnaphthalene and substituted vinylnaphthalenes; vinyl heterocycles, such as N-vinylcarbazole, vinylpyridine and vinyloxazole; vinylcycloalkanes, such as vinylcyclohexane and 3,5-dimethylvinylcyclohexane; acrylamide, methacrylamide, N-substituted acrylamides and methacrylamides; and acrylonitrile, methacrylonitrile and aryl methacrylates. Styrene and substituted styrenes, acrylamide, methacrylamide, acrylonitrile and methacrylonitrile are preferred, and styrene is particularly preferred.

It is also possible for several members of each of the components c1, c2 and c3 to be present in the copolymer used in the present invention.

The amount of component c1 is in general 20 to 60, preferably 30 to 55, mole %; the amount of component c2 is 25 to 80, preferably 35 to 65, mole %, depending on the chain length; and the amount of component c3 is 0 to 30, preferably 3 to 20, mole %. The total amount of monomers with the associated Tg values of at least 80° C., i.e., the amount of c1 and c3, is preferably at least 35 mole %. The acid number of the copolymer is preferably in the range of 170-250.

In order for the copolymers to meet the processing requirements of the dry resist method, it is necessary that they possess a glass transition temperature Tg within a certain range. The Tg values of suitable copolymers can be calculated approximately from the Tg values of the homopolymers of the individual components, according to the following formula:

$$\frac{100}{T_{gMP}} = \frac{m_A}{T_{gA}} + \frac{m_B}{T_{gB}} + \frac{m_C}{T_{gC}} + \cdots$$

In this formula,

| | |
|---|---|
| $T_{gMP}$ | denotes the glass transition temperature of the copolymer (in ° Kelvin), |
| $T_{gA\,(B,\,C\ldots)}$ | denotes the glass transition temperature of the homopolymer of A (B, C, etc.) (in ° Kelvin) and |
| $m_{A\,(B,\,C\ldots)}$ | denotes the amount of A (B, C, etc.) in the copolymer, in % by weight. |

The Tg value for a copolymer suitable for use in the mixture of the present invention should in general be between 35° and 70° C., preferably between 40° and 60° C.

The copolymers employed in the present invention are preferably prepared by mass polymerization, i.e., without the addition of substantial amounts of solvents or dispersants, in the presence of polymerization initiators which form free radicals. The preparation is carried out in a conventional manner in flat containers, in order to permit better temperature monitoring. Peroxides or azo compounds, which form free radicals when heated, are used as initiators, in a known manner. In order to obtain a uniform molecular weight distribution, it is advantageous to add a small amount of a chain regulator, such as a mercapto compound. It is also possible to add a small amount (e.g., less than 10% by weight of the monomer mixture) of a solvent, such as water or a lower alcohol. The temperature can be between about 30° and 130° C.

The preparation process, i.e. the application of mass polymerization, has a substantial effect on the flexibility and resilience of the copolymer, i.e., on those properties which are essential when the mixture is used as a dry resist for the tenting technique.

Mixtures according to the present invention contain polymerizable compounds haing at least two terminal ethylenic double bonds. The polymerizable compounds generally used are esters of acrylic or methacrylic acid with polyhydric, preferably primary, alcohols. Examples of suitable polyhydric alcohols are ethylene glycol, propylene glycol, butane-1,4-diol, butane-1,3-diol, diethylene glycol, triethylene glycol, polyethylene glycols and polypropylene glycols having molecular weights of about 200 to 1,000, neopentylglycol, trimethylolethane and trimethylol propane, pentaerythritol and oxyethylated bisphenol A derivatives. Bisacrylates and bismethacrylates which contain urethane groups, and which are obtained by reacting 1 mole of a diol with 2 moles of a diisocyanate and 2 moles of a hydroxyalkyl acrylate or methacrylate, are particularly suitable. Monomers of this type which contain urethane groups are described in German Offenlegungsschrift No. 2,822,190. Similar monomers are described in German Offenlegungsschrift No. 3,048,502.

A large number of substances can be used in the mixture of the present invention as polymerization initiators which can be activated by radiation, particularly actinic light. Examples are benzoin and its derivatives, trichloromethyl-s-triazines, carbonylmethyleneheterocyclic compounds containing trihalomethyl groups, for example 2-(p-trichloromethylbenzoylmethylene)-3-ethyl benzothiazoline, acridine derivatives, for example 9-phenylacridine, 9-p-methoxyphenylacridine, 9-acetylaminoacridine and benz(a)acridine. Other examples are phenazine derivatives, for example 9,10-dimethylbenz(a)phenazine and 10-methoxybenz(a)phenazine, quinoxaline derivatives, for example 6,4',4''-trimethoxy-2,3-diphenylquinoxaline and 4',4''-dimethoxy-2,3-diphenyl-5-azaquinoxaline, and quinazoline derivatives. The initiators are generally employed in the present invention in an amount of 0.01 to 10, preferably 0.05 to 4, % by weight, relative to the non-volatile components of the mixture.

The mixture according to the present invention generally contains 30 to 70, preferably 40 to 60, % by weight of binder and 30 to 70, preferably 40 to 60, % by weight of polymerizable compounds, relative in each case to the total amount of non-volatile components.

The mixture can contain, as further conventional components, polymerization inhibitors, hydrogen donors, sensitometric regulators, dyes, pigments, plasticizers and thermally activatable crosslinking agents.

Suitable actinic radiation to which the mixture according to the present invention is sensitive is any electromagnetic radiation whose energy is sufficient to initiate polymerization. Visible and ultraviolet light, x-rays and electron radiation are particularly suitable. Laser radiation in the visible and UV range can also be used. Short-wavelength visible and near-UV light is preferred.

Examples of suitable supports for recording materials produced using the mixture according to the invention are aluminum, steel, zinc, copper or screens or plastic films of, for example, polyethylene terephthalate. The surface of the support can be pretreated chemically or mechanically in order to adjust the adhesion of the layer to the appropriate level.

The mixture according to the present invention is preferably used as a dry photoresist material, and has proven particularly useful when the tenting technique is employed. For this purpose, the mixture can be applied in a conventional manner, as a preproduced, transferable dry resist film, onto the workpiece to be processed, for example, onto base material for printed circuit boards. In general, the dry resist material is prepared by applying a solution of the mixture in a solvent onto a suitable base, such as a polyester film, and drying it. The thickness of the resist layer can be about 10 to 80 $\mu$m, and is preferably 20 to 60 $\mu$m. The free surface of the layer is preferably covered with a cover film of, for example, polyethylene or polypropylene. The ready-prepared laminate can be stored as a large roll and can be cut, as required, into resist rolls of any width.

The films can be processed using apparatus conventionally employed in dry resist technology. In a commercial laminating apparatus, the cover film is peeled off and the photoresist layer is laminated with drilled, copper-plated base material. The board prepared in this manner is exposed through an image-bearing transparency and then developed in a conventional manner after the base film has been removed.

Suitable developers are aqueous, preferably aqueous alkaline, solutions, e.g., solutions of alkali metal phosphates, carbonates or silicates, to which, if required, small amounts (for example, up to 10% by weight) of water-miscible organic solvents or wetting agents can be added.

The mixtures according to the invention can be employed for a very large range of uses. They are particularly advantageously used in the form of a dry resist film for the production of resists, i.e., protective layers against etching or plating resists, on metallic supports such as copper.

In this application, the outstanding resilience and toughness of the photoresist layers produced from the mixture according to the invention can be exploited to full advantage, both in the unexposed and in the exposed state. The photopolymerizable layer laminated with copper adheres so firmly that the self-supporting areas of the layer covering the holes remain undamaged when the support film is removed, i.e., the self-supporting areas are not torn away with the support film. With layers formed from the mixture of the present invention, it is possible to cover holes of 6 mm diameter and more, the layer remaining undamaged during removal of the film, development, electroplating and/or etching.

In spite of the high molecular weight of the copolymers used, layers comprised of mixtures according to the present invention can be developed completely with pure aqueous, slightly alkaline developer solutions. The binders of the present invention exhibit better miscibility within a wider range of proportions, with the conventional monomers than do corresponding binders having a low molecular weight; the addition of a plasticizer is not necessary. The mixtures also possess good resistance to developers, etching solutions and electroplating baths.

The mixtures according to the present invention are particularly suitable for use by the dry resist method. They are also suitable for other applications in which flexibility and toughness of a photosensitive layer are important, for example, in preparing photoresist solutions, printing plates, relief images, screens for screen printing, and color prooffing films.

The examples below illustrate preferred embodiments of the mixture according to the present invention. If not stated otherwise, percentages and amounts are understood as being in weight units. Parts by weight bear the same relation to parts by volume as does the gram to the cubic centimeter.

EXAMPLE 1

A solution containing

| | |
|---|---|
| 6.5 | parts by weight of the terpolymer described below, |
| 8.8 | parts by weight of a polymerizable diurethane prepared by reacting 1 mole of triethylene glycol, 2 moles of 2,2,4-trimethylhexamethylene diisocyanate and 2 moles of hydroxyethyl methacrylate, |
| 0.25 | part by weight of 9-phenylacridine and |
| 0.025 | part by weight of a blue dye obtained by coupling 2,4-dinitro-6-chlorobenzenediazonium salt with 2-methoxy-5-acetylamino-N,N—diethylaniline in |
| 15 | parts by weight of butanone and |
| 15 | parts by weight of ethanol | was applied, by spin-coating, to a biaxially oriented, heat-set, 25 μm-thick polyethylene terephthalate film so that, after drying at 100° C., a weight per unit area of 45 q/m² was obtained.

The terpolymer was prepared as follows:

A monomer mixture consisting of n-hexyl methacrylate, methacrylic acid and styrene in a weight ratio of 60:30:10 was mixed with 0.05% by weight of azoisobutyronitrile, 0.02% by weight of tert-butyl perisononanoate and 0.5% by weight of tert-dodecylmercaptan, and the mixture was introduced, for polymerization, into flat hollow chambers made of steel sheet. The mixture was heated to 50° C. in a water bath or air bath until it solidified. In order to achieve a sufficiently high final conversion, the mixture was further heated to 100° C. and kept at this temperature for some time. After cooling, the hollow chambers were opened, and the polymer blocks removed therefrom were comminuted mechanically. A polymer having a kinematic viscosity $\nu$ of 32 mm²/s (15% strength in ethanol) was obtained; the mean molecular weight $\overline{M}_w$ was 128,000, as measured by light scattering. (Low angle laser light scattering photometer KMX-6 Chromafix GmbH, D 6903 Neckargemünd, West Germany, helium-neon laser $\lambda = 633$ nm, RT). The acid number was 195 and the conversion greater than 97%.

The dry resist film prepared in the abovedescribed manner was laminated at 115° C., using a commercial laminating apparatus, with a phenoplast laminate board bonded to 35 μm-thick copper foil, and exposed for 8 seconds to a 5 kW metal halide lamp, the distance between the lamp and the vacuum frame being 110 cm. The transparency used was a line transparency with line widths and spacings down to 80 μm.

After exposure, the polyester film was removed and the layer developed for 120 seconds with 1% strength sodium carbonate solution in a spray-developing apparatus. The board was then rinsed for 30 seconds with tap water, etched for 30 seconds in a 15% strength ammonium peroxydisulfate solution, rinsed again with water, dipped for 30 seconds into 10% strength sulfuric acid, and then plated in the following electrolytic baths:

(1) for 60 minutes in a copper-plating bath from Schlötter, Geislingen/Steige, type "Glanzkupfer-Bad"
    current density: 2.5 A/dm²
    thickness of metal layer: about 30 μm
    temperature: room temperature
(2) for 15 minutes in a lead-tin bath LA from Schlötter, Geislingen/Steige
    current density: 2 A/dm²
    thickness of metal layer: 15 μm
    temperature: room temperature The board did not exhibit any underpenetration or damage.

It was then possible to remove layer material from the board in 5% strength KOH solution at 50° C., and the exposed copper could be etched away in the conventional etching media.

In another experiment, the photoresist layer was laminated with a test board that had been bonded to copper and had holes with a diameter between 1 and 6 mm. The resist was then exposed through a photographic negative corresponding to the holes (diameter of the transparent areas 1.4 to 6.4 mm). Thereafter, the unexposed parts of the layer were washed out with 1% strength sodium carbonate solution, and the exposed copper was etched away with ammoniacal copper chloride solution. After the etching procedure, all drilled holes were found to be covered with cured photoresist.

For comparison, the binder according to the present invention was replaced by an analogous binder having a molecular weight of about 33,000 [$\nu$ (15% strength in ethanol) = 11 mm²/sec] according to German Offenlegungsschrift No. 2,363,806, the latter binder having been prepared by polymerization in 33% strength solution in butanone. A tacky photoresist layer which was difficult to process was obtained. Because the low molecular weight binder displayed a poorer action with regard to the production of a solid layer, layer substance emerged at the cut edges when resist rolls were stored, particularly at elevated temperatures. Upon lamination with a base material provided with holes, a ring having a smaller layer thickness formed around each drilled hole. A layer of this type could not be used for the tenting technique.

The dry resist layers described in German Offenlegungsschrift No. 2,363,806, Example 4 and in German Offenlegungsschrift No. 2,822,190, Example 1, both of which contain the above binder, are also unsuitable for covering drilled holes having a diameter of more than 1 mm.

EXAMPLE 2

Results comparable to those described above were achieved when, instead of using the urethane stated in Example 1, the following monomer mixtures were employed:

(a)

5.8 parts by weight of the urethane from Example 1 and 1.5 parts by weight of triethylene glycol dimethacrylate (b)

5.8 parts by weight of the urethane from Example 1 and 1.5 parts by weight of polyethylene glycol-400 dimethacrylate.

The advantage of these photoresist layers was evident in their shorter development time:

|  | Layer of Example | | |
| --- | --- | --- | --- |
|  | 1 | 2a | 2b |
| Development Time (seconds) | 95 | 75 | 75 |

EXAMPLE 3

In place of the binder used in the coating solution described in Example 1, the same amounts of the following terpolymers were employed:
(a) terpolymer of n-hexyl methacrylate, methacrylic acid and styrene (60:30:10), having a mean molecular weight ($\overline{M}_w$) of about 185,000, a kinematic viscosity $\nu$ (15% strength in ethanol) of 74 mm$^2$/s and an acid number of 195,
(b) terpolymer of n-hexyl methacrylate, methacrylic acid and styrene (60:35:5), having an $\overline{M}_w$ of 74,000, a kinematic viscosity $\nu$ (15% strength in ethanol) of 23 mm$^2$/s and an acid number of 228,
(c) terpolymer of n-hexyl methacrylate, methacrylic acid and styrene (60:35:5), having an $\overline{M}_w$ of 94,000, a kinematic viscosity $\nu$ (15% strength in ethanol) of 32 mm$^2$/s and an acid number of 228,
(d) terpolymer of n-hexyl methacrylate, methacrylic acid and methyl methacrylate (60:35:5), having a kinematic viscosity $\nu$ (15% strength in ethanol) of 36 mm$^2$/s and an acid number of 228, and
(e) copolymer of n-hexyl methacrylate and methacrylic acid (65:35), having a kinematic viscosity $\nu$ (15% strength in ethanol) of 34 mm$^2$/s and an acid number of 228.

In all cases, satisfactory covering of the drilled holes (tenting) was achieved.

EXAMPLE 4

A coating solution was prepared from:

| | |
| --- | --- |
| 4 | parts by weight of the terpolymer described in Example 1, |
| 4 | parts by weight of a diurethane obtained by reacting 1 mole of 2,2,4-trimethylhexamethylene diisocyanate with 2 moles of hydroxyethyl methacrylate, |
| 0.17 | part by weight of 9-phenylacridine, |
| 0.02 | part by weight of a blue dye obtained by coupling 2,4-dinitro-6-chlorobenzenediazonium salt with 2-methoxy-5-acetylamino-N—cyanoethyl-N—hydroxyethyl-aniline and |
| 0.01 | part by weight of 5-nitro-2-[2-methyl-4-(N—ethyl-N—cyanoethyl)-aminobenzeneazo]-benzothiazole in |
| 17 | parts by weight of butanone and |
| 56 | parts by weight of ethylene glycol monomethyl ether. |

The solution was applied, by spin-coating, onto electrochemically roughened and anodized aluminum which had an oxide layer of 2 g/m$^2$ and had been pretreated with an aqueous solution of polyvinylphosphonic acid. A resulting dry weight of 3.5 g/m$^2$ was obtained. The plate was then provided with a polyvinyl alcohol cover layer of 4 g/m$^2$. The printing plate was halved, and both halves were exposed for 2 seconds to a 5 kW metal halide lamp under a 13-step continuous tone wedge and under 60-line/cm and 120-line/cm halftone step wedges. After exposure, one half was additionally heated for 5 seconds at 100° C. in a through-circulation dryer.

Thereafter, developing was carried out using a developer of the following composition:

| | |
| --- | --- |
| 3.0 | parts by weight of sodium metasilicate.9H$_2$O, |
| 0.03 | part by weight of a non-ionic wetting agent (coconut fatty alcohol polyoxyethylene ether containing about 8 ethylene oxide units), |
| 0.003 | part by weight of an antifoam agent and |
| 96.967 | parts by weight of fully deionized water. |

8(9) fully crosslinked wedge steps were obtained without subsequent heating, while 11(12) fully crosslinked wedge steps were obtained when subsequent heating was carried out.

What is claimed is:

1. A radiation-polymerizable mixture suitable for producing a transferable, dry photoresist film, comprising
   (a) 30 to 70% by weight of a first compound capable of undergoing free radical polymerization, said first compound containing at least two terminal ethylenically unsaturated groups and having a boiling point above 100° C. under atmospheric pressure,
   (b) 0.01 to 10% by weight of a second compound capable of initiating said polymerization of said first compound when exposed to actinic radiation, and
   (c) 20 to 70% by weight of a water-insoluble copolymer which is soluble in aqueous alkaline solutions and which comprises
      (c1) 20 to 60 mole-% of acrylic acid or methacrylic acid,
      (c2) 25 to 80 mole-% of an alkyl methacrylate having at least 4 carbon atoms in the alkyl group, a homopolymer of said methacrylate (c2) having a glass transition temperature of not more than 20° C., and
      (c3) 3 to 20 mole-% of a monomeric ethylenically unsaturated compound which is copolymerizable with said acid (c1) and said methacrylate (c2), a homopolymer of said compound (c3) having a glass transition temperature of at least 80° C., wherein said copolymer has a mean molecular weight in the range from about 65,000 to 150,000 and is prepared by mass polymerization.

2. A radiation-polymerizable mixture as claimed in claim 1, wherein said compound (c3) is styrene or a substituted styrene.

3. A radiation-polymerizable mixture as claimed in claim 1, wherein said first compound is an acrylate or methacrylate of a polyhydric alcohol.

4. A radiation-polymerizable mixture as claimed in claim 1, wherein said copolymer contains 20 to 60 mole % of units derived from an $\alpha,\beta$-unsaturated carboxylic acid.

5. A radiation-polymerizable mixture as claimed in claim 1, wherein said acid (c1) is acrylic acid or methacrylic acid.

6. A radiation-polymerizable mixture as claimed in claim 1, wherein said copolymer possesses a glass transition temperature in the range of about 35° and 70° C.

7. A radiation-polymerizable mixture as claimed in claim 1, wherein said copolymer has an acid number between about 170 and 250.

8. A copolymer comprising (i) 20 to 60 mole-% of acrylic acid or methacrylic acid, (ii) 25 to 80 mole-% of an alkyl methacrylate having at least 4 carbon atoms in the alkyl group, a homopolymer of said methacrylate (ii) having a glass transition temperature of not more than 20° C., and (iii) 3 to 20 mole-% of a monomeric ethylenically unsaturated compound which is copolymerizable with said acid (i) and said methacrylate (ii), a homopolymer of said compound (iii) having a glass transition temperature of at least 80° C., wherein said copolymer has a mean molecular weight in the range from about 65,000 to 150,000 and is prepared by mass polymerization.

9. A process for producing a copolymer, comprising the step of polymerizing a monomeric mixture comprised of an $\alpha,\beta$-unsaturated aliphatic carboxylic acid and an alkyl methacrylate which comprises an alkyl group containing at least 4 carbon atoms, said polymerizing being effected by mass polymerization in the presence of a free radical polymerization initiator, to produce a copolymer comprised of at least said unsaturated carboxylic acid and said alkyl methacrylate.

10. A process as claimed in claim 9, wherein said mixture further comprises at least one monomeric ethylenically unsaturated compound which is copolymerizable with said unsaturated carboxylic acid and said alkyl methacrylate, a homopolymer of said compound having a glass transition temperature of at least 80° C.

11. A process as claimed in claim 9, wherein said polymerizing is carried out in the presence of a chain regulator.

12. A transferable, dry photoresist film comprised of a radiation-polymerizable mixture comprising (a) 30 to 70% by weight of a first compound capable of undergoing free radical polymerization, said first compound containing at least two terminal ethylenically unsaturated groups and having a boiling point above 100° C. under atmospheric pressure, (b) 0.01 to 10% by weight of a second compound capable of initiating said polymerization of said first compound when exposed to actinic radiation, and (c) 20 to 70% by weight of a water-insoluble copolymer which is soluble in aqueous alkaline solutions and which comprises (c1) 20 to 60 mole-% of acrylic acid and methacrylic acid, (c2) 25 to 80 mole-% of an alkyl methacrylate having at least 4 carbon atoms in the alkyl group, a homopolymer of said methacrylic (c2) having a glass transition temperature of not more than 20° C., and (c3) 3 to 20 mole-% of a monomeric ethylenically unsaturated compound which is copolymerizable with said acid (c1) and said methacrylate (c2), a homopolymer of said compound (c3) having a glass transition temperature of at least 80° C., wherein said copolymer has a mean molecular weight in the range from about 65,000 to 150,000 and is prepared by mass polymerization.

13. A photoresist film as claimed in claim 12, said film having a thickness of about 10 to 80 μm.

14. A photoresist film as claimed in claim 13, wherein said thickness is between about 20 and 60 μm.

15. A photoresist film as claim in claim 12, wherein said film consists essentially of said constituents (a), (b) and (c).

16. A radiation-polymerizable mixture as claimed in claim 1, wherein said mixture consists essentially of said constituents (a), (b) and (c).

17. A radiation-polymerizable mixture as claimed in claim 1, wherein said copolymer (c) has a kinematic viscosity (15% strength in ethanol) of between about 23 and 74 mm²/s.

* * * * *

UNITED STATES PATENT AND TRADEMARK OFFICE
CERTIFICATE OF CORRECTION

PATENT NO. : 4,705,740
DATED : November 10, 1987
INVENTOR(S) : GEISSLER et al.

It is certified that error appears in the above—identified patent and that said Letters Patent is hereby corrected as shown below:

Title page:

[22] Change "Jul. 11, 1985" to --Jul. 10, 1985--.

Claim 15, line 1, change "claim" (first occurrence) to --claimed--.

Signed and Sealed this

Sixth Day of September, 1988

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,705,740

DATED : November 10, 1987

INVENTOR(S) : Ulrich Geissler and Klaus Albrecht

It is certified that error appears in the above-identified patent and that said Letters Patent is hereby corrected as shown below:

On the Title Page, Item [73] Assignee: "Hoechst Aktiengesellschaft, Fed. Rep. of Germany" should read --Hoechst Aktiengesellschaft and Roehm GmbH Chemische Fabrik, Fed. Rep. of Germany--.

Signed and Sealed this

Sixth Day of June, 1989

Attest:

DONALD J. QUIGG

Attesting Officer

Commissioner of Patents and Trademarks